(12) United States Patent
Yeh et al.

(10) Patent No.: US 10,475,723 B1
(45) Date of Patent: Nov. 12, 2019

(54) IGBT HEAT DISSIPATION STRUCTURE

(71) Applicant: Amulaire thermal technology, INC., New Taipei (TW)

(72) Inventors: Tze-Yang Yeh, New Taipei (TW); Chun-Lung Wu, New Taipei (TW)

(73) Assignee: Amulaire thermal technology, INC., New Taipei (TW)

( * ) Notice: Subject to any disclaimer, the term of this patent is extended or adjusted under 35 U.S.C. 154(b) by 0 days.

(21) Appl. No.: 16/182,535

(22) Filed: Nov. 6, 2018

(30) Foreign Application Priority Data

May 28, 2018 (TW) .............................. 107118138 A

(51) Int. Cl.
| H01L 23/34 | (2006.01) |
| H01L 23/48 | (2006.01) |
| H01L 21/00 | (2006.01) |
| H01L 23/373 | (2006.01) |
| H01L 23/00 | (2006.01) |
| H01L 29/739 | (2006.01) |

(52) U.S. Cl.
CPC .......... *H01L 23/3735* (2013.01); *H01L 24/83* (2013.01); *H01L 29/7393* (2013.01)

(58) Field of Classification Search
CPC ............. H01L 23/3735; H01L 29/7395; H01L 29/7393; H01L 24/83
See application file for complete search history.

(56) References Cited

U.S. PATENT DOCUMENTS

| 2007/0166877 A1* | 7/2007 | Otremba | H01L 23/49513 438/106 |
| 2007/0284731 A1* | 12/2007 | Atsumi | H01L 23/3737 257/706 |
| 2012/0001316 A1* | 1/2012 | Hauenstein | H01L 23/13 257/690 |
| 2013/0140684 A1* | 6/2013 | Hauenstein | H01L 23/13 257/659 |
| 2013/0147016 A1* | 6/2013 | Hauenstein | H01L 23/13 257/536 |
| 2015/0255419 A1* | 9/2015 | Nishimoto | H01L 24/32 257/773 |

\* cited by examiner

*Primary Examiner* — Alonzo Chambliss
(74) *Attorney, Agent, or Firm* — Li & Cai Intellectual Property Office

(57) ABSTRACT

An IGBT heat dissipation structure includes a layer of IGBT chips, a bonding layer, a cold spray layer, a thermal spray layer, and a heat dissipation layer. The thermal spray layer is disposed on top of the heat dissipation layer. The cold spray layer is disposed on top of the thermal spray layer. The bonding layer is disposed on top of the cold spray layer, and the layer of IGBT chips is disposed on top of the bonding layer.

10 Claims, 3 Drawing Sheets

IGBT HEAT DISSIPATION STRUCTURE

BACKGROUND OF THE INVENTION

1. Field of the Invention

The present disclosure relates to an IGBT (Insulated Gate Bipolar Transistor) heat dissipation structure, and in particular, to an IGBT heat dissipation structure used in electric vehicles/hybrid vehicles.

2. Description of Related Art

Most of the high-power inverters currently used in electric vehicles/hybrid vehicles use IGBT (Insulated Gate Bipolar Transistor) chips. Therefore, the heat generated by the high-power inverters during operation will cause the IGBT chip temperature to rise. If no proper heat dissipation measures are incorporated, the temperature of the IGBT chip may exceed the allowable temperature, resulting in deterioration of performance and damage. Therefore, the IGBT heat dissipating efficiency has become a major problem in the industry.

At present, the direct bonded copper (DBC) substrate has become the material of choice for IGBT heat dissipation structures. Referring to FIGS. 1 and 2, the existing IGBT heat dissipation structure mainly includes a layer 11A of IGBT chips, an upper solder layer 12A, a DBC substrate 13A, a lower solder layer 14A, and a heat dissipation layer 15A. Among them, the composition of the DBC substrate 13A is an upper metal layer 131A, a ceramic layer 132A, and a lower metal layer 133A from top to bottom.

However, the DBC substrate 13A has a limited ability to spread heat. When heat is generated by the layer 11A of IGBT chips, it cannot be transferred to the heat dissipation layer 15A through the DBC substrate 13A in time. Moreover, the connection between the DBC substrate 13A and the heat dissipation layer 15A can only be made through the lower solder layer 14A. In practice, the entire lower solder layer 14A is highly prone to experience an empty soldering phenomenon which causes an increase in interface impedance, thereby affecting thermal conductivity.

The abovementioned drawbacks of the existing IGBT heat dissipation structure suggest that there is still room for improvement in the art.

SUMMARY OF THE INVENTION

One objective of the present disclosure is to provide an IGBT heat dissipation structure that can overcome the aforementioned drawbacks.

In order to achieve the object above, one of the embodiments of the instant disclosure provides an IGBT heat dissipation structure, including a layer of IGBT chips, a bonding layer, a cold spray layer, a thermal spray layer, and a heat dissipation layer. The thermal spray layer is disposed on the heat dissipation layer. The cold spray layer is disposed on the thermal spray layer. The bonding layer is disposed on the cold spray layer, and the layer of IGBT chips is disposed on the bonding layer.

Preferably, the thermal spray layer is composed of a ceramic material.

Preferably, the ceramic material is selected from aluminum oxide, aluminum nitride or silicon nitride.

Preferably, the thermal spray layer has a thickness of about 20-500 µm.

Preferably, the cold spray layer is composed of a metal material.

Preferably, the metal material is selected from copper, copper alloy or nickel alloy.

Preferably, the cold spray layer has a thickness of about 10-1000 µm.

Preferably, the cold spray layer is further formed as a patterned layer.

For further understanding of the present disclosure, the following embodiments are provided to facilitate the disclosure of the present disclosure.

DETAILED DESCRIPTION OF PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
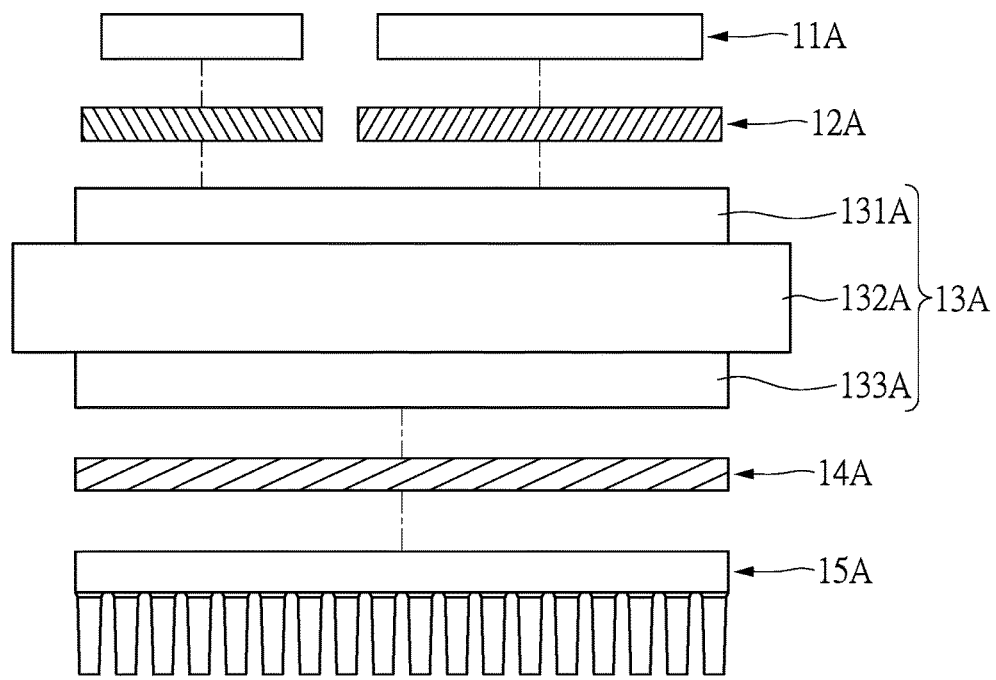
FIG. 1 is an exploded side schematic view illustrating an existing IGBT heat dissipation structure.
Figure 2:
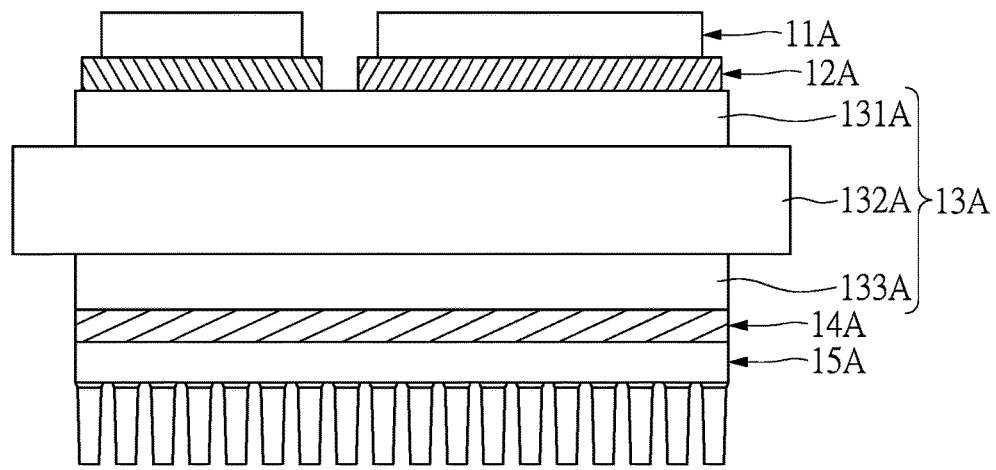
FIG. 2 is a side schematic view illustrating the existing IGBT heat dissipation structure.
Figure 3:
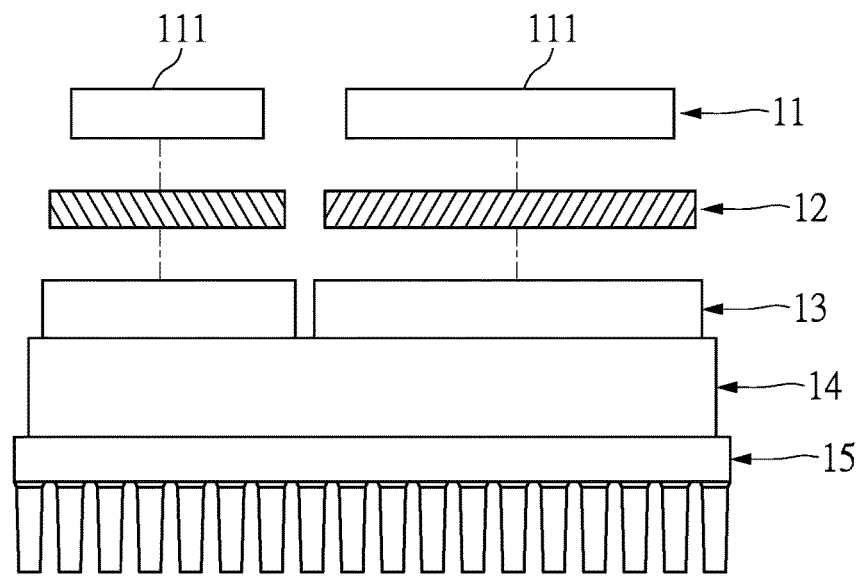
FIG. 3 is an exploded side schematic view illustrating an IGBT heat dissipation structure of the present disclosure.
Figure 4:
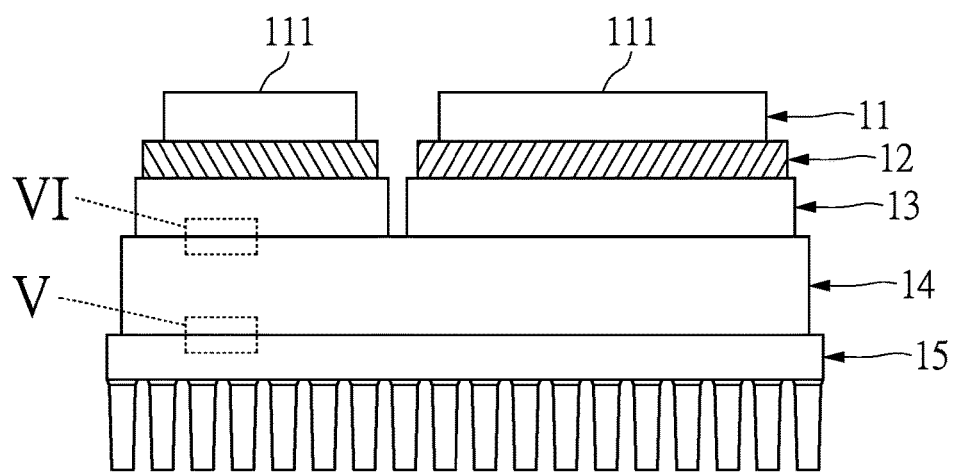
FIG. 4 is a side schematic view illustrating the IGBT heat dissipation structure of the present disclosure.

Referring to FIGS. 3 and 4, the IGBT heat dissipation structure in accordance with the present disclosure has a layer 11 of IGBT chips 111, a bonding layer 12, a cold spray layer 13, a thermal spray layer 14, and a heat dissipation layer 15 from top to bottom.

The thermal spray layer 14 is disposed on top of the heat dissipation layer 15. The heat dissipation layer 15 can be a heat sink or a heat dissipation metal plate. The thermal spray layer 14 is composed of a ceramic material.

In detail, the thermal spray layer 14 is formed by utilizing the plasma spraying process, which raises the ceramic powder from a normal temperature to a high temperature of 2500 degrees Celsius or higher by the high heat generated by a plasma torch, thereby causing the ceramic powder to be converted from a solid state to a molten liquid state. The molten ceramic is then blown by a high-velocity plasma gas, atomized, and sprayed on the surface of the heat dissipation layer 15 to form a thermal spray layer having a predetermined thickness.

The plasma gas used in the present embodiment is argon; however, nitrogen, hydrogen, and other gases may also be used. Therefore, compared with the existing method of using a solder layer to form a connection between the DBC substrate and the heat dissipation layer, the IGBT heat dissipation structure in accordance with the present disclosure forms the thermal spray layer 14 directly on the surface of the heat dissipation layer 15 without having to go through a solder layer.

Furthermore, the ceramic material of the thermal spray layer 14 can be selected from aluminum oxide, but it can also be selected from aluminum nitride or silicon nitride. In addition, the thickness of the thermal spray layer 14 may be set in advance according to the spraying time of the spray coating on the surface of the heat dissipation layer 15. In the present embodiment, the thermal spray layer 14 has a thickness of about 20-500 μm, but preferably 400 μm, to achieve better insulation and heat conduction.

The cold spray layer 13 is disposed on top of the thermal spray layer 14 and is composed of a metal material.

In detail, the cold spray layer 13 is constructed by accelerating the metal powder by a supersonic gas flow, causing the metal powder to crash into the surface of the thermal spray layer 14 at a high speed to be embedded in the thermal spray layer 14. At the same time, the metal powder produces a large amount of plastic deformation, and the original powder morphology is no longer maintained. The metal powder after a large amount of plastic deformation is stacked into a dense layered structure to form a cold spray layer having a predetermined thickness.

In the present embodiment, the thickness of the cold spray layer 13 is between 10-1000 μm, preferably 300 μm.

Furthermore, the metal material of the cold spray layer 13 can be selected from copper, copper alloy or nickel alloy, but it can also be selected from other metals. In addition, the cold spray layer can be formed as a patterned layer by a masking technique on a predetermined area of the surface of the thermal spray layer 14.

The bonding layer 12 is disposed on top of the cold spray layer 13, and the layer 11 of IGBT chips 111 is disposed on top of the bonding layer 12. The bonding layer 12 can be a tin bonding layer, but it can also be a sintered silver layer.

The layer 11 of IGBT chips 111 may include one or more IGBT chips 111. In addition, the one or more IGBT chips 111 are bonded onto the cold spray layer 13 through the bonding layer 12. The heat generated by the one or more IGBT chips 111 can be conducted to the heat dissipation layer 15 by the cold spray layer 13 and the thermal spray layer 14 to dissipate heat outward.

Figure 5:
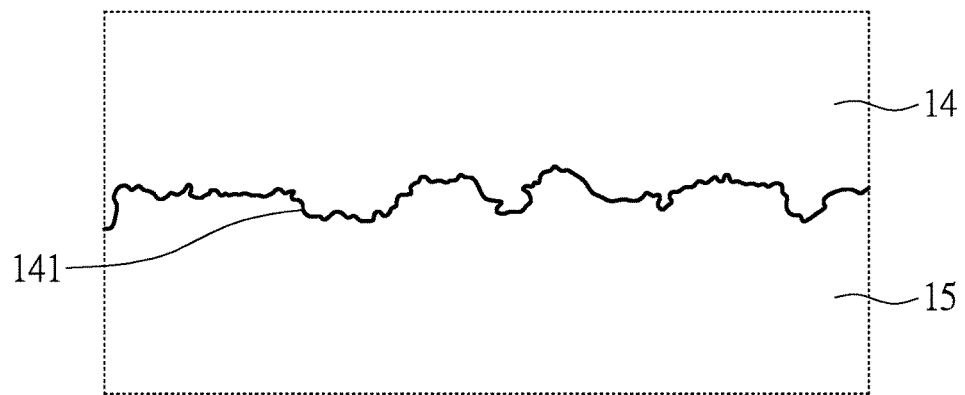
FIG. 5 is an enlarged schematic view of region V in FIG. 4.
Figure 6:
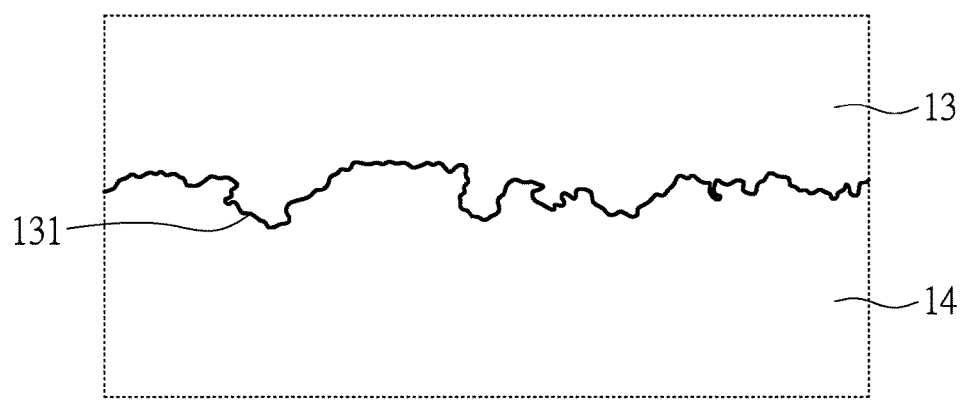
FIG. 6 is an enlarged schematic view of region VI in FIG. 4.

It is worth mentioning that, the bottom surface of the thermal spray layer 14 is formed with first microstructures 141 that are completely embedded within the top surface of the heat dissipation layer 15 to enhance the bonding strength between the two surfaces that are secured together. The first microstructures 141 have non-uniform shapes and sizes, as shown in FIG. 5. Similarly, the bottom surface of the cold spray layer 13 is formed with second microstructures 131 that are completely embedded within the top surface of the thermal spray layer 14 to enhance the bonding strength between the two surfaces that are secured together. The second microstructures 131 have non-uniform shapes and sizes, as shown in FIG. 6. Furthermore, the cold spray layer 13 has a cross-sectional area smaller than the thermal spray layer 14, and the thermal spray layer 14 has a cross-sectional area smaller than the heat dissipation layer 15.

In summary, the IGBT heat dissipation structure in accordance with the present disclosure forms a cold spray layer 13 and a thermal spray layer 14 respectively by two spray methods to rapidly and uniformly conduct the heat of the IGBT chips to the heat dissipation fins of the heat dissipation layer 15. Compared with the DBC substrate of the existing IGBT heat dissipation structure, the IGBT heat dissipation structure in accordance with the present disclosure can simultaneously achieve the advantages of the electrical and thermal conductivity of the cold sprayed metal material and the higher breakdown voltage of the thermal sprayed ceramic material. Moreover, the thermal spray layer is formed directly on the surface of the heat dissipation layer without having to go through a solder layer, so that the heat conduction performance is not affected by the problems of empty soldering and the interface impedance of the solder layer, thereby making the heat dissipation layer capable of having maximum heat absorption and heat dissipation performance.

What is claimed is:

1. An IGBT heat dissipation structure, comprising: a layer of IGBT chips, a bonding layer, a cold spray layer, a thermal spray layer, and a heat dissipation layer; wherein the thermal spray layer is disposed on the heat dissipation layer, the cold spray layer is disposed on the thermal spray layer, the bonding layer is disposed on the cold spray layer, and the layer of IGBT chips is disposed on the bonding layer.

2. The IGBT heat dissipation structure according to claim 1, wherein the thermal spray layer is composed of a ceramic material.

3. The IGBT heat dissipation structure according to claim 2, wherein the ceramic material is selected from aluminum oxide, aluminum nitride or silicon nitride.

4. The IGBT heat dissipation structure according to claim 1, wherein the thermal spray layer has a thickness of about 20-500 μm.

5. The IGBT heat dissipation structure according to claim 4, wherein the cold spray layer has a thickness of about 10-1000 μm.

6. The IGBT heat dissipation structure according to claim 1, wherein the cold spray layer is composed of a metal material.

7. The IGBT heat dissipation structure according to claim 6, wherein the metal material is selected from copper, copper alloy or nickel alloy.

8. The IGBT heat dissipation structure according to claim 1, wherein the cold spray layer is formed as a patterned layer.

9. The IGBT heat dissipation structure according to claim 1, wherein a bottom surface of the thermal spray layer is formed with first microstructures that are completely embedded within a top surface of the heat dissipation layer.

10. The IGBT heat dissipation structure according to claim 9, wherein a bottom surface of the cold spray layer is formed with second microstructures that are completely embedded within a top surface of the thermal spray layer.

* * * * *